United States Patent
Mizuno (10) Patent No.: US 9,209,425 B2
(45) Date of Patent: Dec. 8, 2015

(54) ORGANIC ELECTROLUMINESCENCE ELEMENT, DISPLAY APPARATUS, IMAGE PROCESSING APPARATUS, LIGHTING APPARATUS, AND IMAGE FORMING APPARATUS

(71) Applicant: CANON KABUSHIKI KAISHA, Tokyo (JP)

(72) Inventor: Nobutaka Mizuno, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 63 days.

(21) Appl. No.: 14/224,621

(22) Filed: Mar. 25, 2014

(65) Prior Publication Data

US 2014/0299854 A1 Oct. 9, 2014

(30) Foreign Application Priority Data

Apr. 5, 2013 (JP) .................................. 2013-079339

(51) Int. Cl.
H01L 35/24 (2006.01)
H01L 51/52 (2006.01)
H01L 51/50 (2006.01)
H01L 27/32 (2006.01)

(52) U.S. Cl.
CPC ........ *H01L 51/5271* (2013.01); *H01L 27/3244* (2013.01); *H01L 51/5012* (2013.01)

(58) Field of Classification Search
CPC .................................................. H01L 51/5271
USPC ............................................ 257/40, E51.001
See application file for complete search history.

(56) References Cited

U.S. PATENT DOCUMENTS

| 8,471,463 | B2 | 6/2013 | Sumida et al. |
| 8,729,789 | B2 | 5/2014 | Hasegawa |
| 2012/0133575 | A1 | 5/2012 | Hasegawa |

FOREIGN PATENT DOCUMENTS

JP 2012-134128 A 7/2012

OTHER PUBLICATIONS

Gontijo, et al., "Coupling of InGaN Quantum-Well Photoluminescence to Silver Surface Plasmons," Physical Review B, vol. 60, No. 16, pp. 11 564-11 567 (1999).
Nowy, et al., "Light Extraction and Optical Loss Mechanisms in Organic Light-Emitting Diodes: Influence of the Emitter Quantum Efficiency," Journal of Applied Physcis, vol. 104, pp. 123109-1-123109-9 (2008).

*Primary Examiner* — Anthony Ho
(74) *Attorney, Agent, or Firm* — Fitzpatrick, Cella, Harper & Scinto (57) ABSTRACT

Provided is an organic electroluminescence element, including: a light reflective electrode; a light transmissive electrode; an emission layer formed between the light reflective electrode and the light transmissive electrode; a low-refractive index layer having a refractive index at a maximum peak wavelength of an emission spectrum of light emitted from the emission layer lower than that of the emission layer, the low-refractive index layer being formed between the light reflective electrode and the emission layer; and a light extraction member for changing an exiting direction of the light emitted from the emission layer, the light extraction member being formed on the light transmissive electrode, in which an optical path L between a maximum emission surface of the emission layer and the light reflective electrode satisfies a specific expression.

10 Claims, 5 Drawing Sheets

ORGANIC ELECTROLUMINESCENCE ELEMENT, DISPLAY APPARATUS, IMAGE PROCESSING APPARATUS, LIGHTING APPARATUS, AND IMAGE FORMING APPARATUS

BACKGROUND OF THE INVENTION

1. Field of the Invention

The present invention relates to an organic electroluminescence (EL) element, and a display apparatus, an image processing apparatus, a lighting apparatus, and an image forming apparatus each using the element.

2. Description of the Related Art

In recent years, an organic EL element that spontaneously emits light at a driving voltage as low as about several volts has been attracting attention. The organic EL element has excellent features such as surface emitting characteristics, a light weight, and visibility. Accordingly, the element has been used as a thin display, lighting equipment, or a head-mounted display in order that those excellent features may be exploited.

One problem to be solved in the field of the organic EL element is an improvement in light extraction efficiency. Although a general organic EL element adopts a structure in which an emission layer and an organic functional layer functionally separated from the emission layer are present between a pair of electrodes, the light extraction efficiency of the organic EL element is said to be about 20% to 30%. One cause for the foregoing is as described below. Total reflection may occur at an interface between the emission layer contributing to light emission and the air because the refractive index of the emission layer, which is about 1.7 to 1.8, is higher than the refractive index of the air. Accordingly, light to be actually extracted into the air is limited.

In Japanese Patent Application Laid-Open No. 2012-134128, it is described that even light that has heretofore undergone total reflection is collectively extracted by providing a light extraction member (light extraction unit) such as a lens, which changes the direction of light, in order to improve the light extraction efficiency of an organic EL element. It is also described that an optical path between an emission layer and a metal electrode is specified to the minimum order of interference as an improvement in display performance.

By the way, the behavior of light in an organic EL element can be calculated by an optical simulation described in, for example, S. Nowy et. al., Journal of Applied Physics 104, 123109 (2008). It has also been known that the reflectance, transmittance, phase shift, and the like of an optical multilayer thin film can be calculated (see I. Gontijo et. al., Physical Review B, Vol. 60, (1999), 11564).

Total reflection due to a high refractive index of an emission layer has heretofore been considered to be a main cause limiting the light extraction efficiency of an organic EL element. However, a recent research has pointed out that when the emission layer and a metal film (light reflective electrode) are close to each other, energy from an exciton is coupled to a plasmon on a metal surface, whereby the energy from the exciton is lost. In particular, when an optical path between the emission layer and a metal electrode is set to coincide with the minimum order of interference, the energy loss resulting from the coupling to the plasmon enlarges. In addition, it has been found that the energy loss due to the plasmon is not alleviated even by providing a light extraction unit.

SUMMARY OF THE INVENTION

The present invention has been accomplished to solve the problems and the present invention is directed to providing a high-efficiency organic EL element.

An organic EL element according to one aspect of the present invention includes: a light reflective electrode; a light transmissive electrode; an emission layer formed between the light reflective electrode and the light transmissive electrode; a low-refractive index layer having a refractive index at a maximum peak wavelength of an emission spectrum of light emitted from the emission layer lower than that of the emission layer, the low-refractive index layer being formed between the light reflective electrode and the emission layer; and a light extraction member for changing an exiting direction of the light emitted from the emission layer, the light extraction member being formed on the light transmissive electrode, in which an optical path L between a maximum emission surface of the emission layer and a reflection surface of the light reflective electrode satisfies the following expression (1).

$$\left(-1 - \frac{\phi}{90}\right) \times \left(\frac{\lambda}{8}\right) < L < \left(1 - \frac{\phi}{90}\right) \times \left(\frac{\lambda}{8}\right) \quad (1)$$

In the expression (1), $\lambda$ represents the maximum peak wavelength of the emission spectrum and $\phi$ represents a phase shift [deg] in the light reflective electrode.

Further features of the present invention will become apparent from the following description of exemplary embodiments with reference to the attached drawings.

DESCRIPTION OF THE EMBODIMENTS

An organic EL element of the present invention includes: a light reflective electrode; a light transmissive electrode; and an emission layer formed between the light reflective electrode and the light transmissive electrode.

In the present invention, a low-refractive index layer having a refractive index at the maximum peak wavelength of the emission spectrum of light emitted from the emission layer lower than that of the emission layer is formed between the light reflective electrode and the emission layer. In the present invention, the refractive index of the low-refractive index layer is lower than the refractive index of the emission layer by preferably 0.1 or more, more preferably 0.2 or more.

In the present invention, the low-refractive index layer has a function as a charge injection/transport layer, the number of which to be formed is at least one, but the number of low-refractive index layers to be formed between the emission layer and the light reflective electrode is not particularly limited. In other words, the low-refractive index layer to be formed between the emission layer and the light reflective electrode may be one layer, or may be two or more layers. In addition, when two or more low-refractive index layers are formed between the emission layer and the light reflective electrode, a high-refractive index layer may be formed between the multiple low-refractive index layers so as to be in contact with the low-refractive index layers. Here, the high-refractive index layer is a layer having a refractive index higher than that of each low-refractive index layer, and the refractive index of the high-refractive index layer is a refractive index equal to or more than the refractive index of the emission layer. The refractive index of the high-refractive index layer is higher than the refractive index of each low-refractive index layer by preferably 0.1 or more, more preferably 0.2 or more.

In addition, in the present invention, a light extraction member for changing the exiting direction of the light emitted from the emission layer is formed on the light transmissive electrode. It is to be noted that the term "light extraction member" as used herein refers to, for example, a lens member for condensing light output from the emission layer.

In the present invention, an optical path L between the maximum emission surface of the emission layer and the light reflective electrode satisfies the following expression (1).

$$\left(-1-\frac{\phi}{90}\right)\times\left(\frac{\lambda}{8}\right) < L < \left(1-\frac{\phi}{90}\right)\times\left(\frac{\lambda}{8}\right) \quad (1)$$

In the expression (1), $\lambda$ represents the maximum peak wavelength of the emission spectrum and $\phi$ represents a phase shift [deg] in the light reflective electrode.

In the present invention, the optical path L more preferably satisfies the following expression (1').

$$\left(-1-\frac{\phi}{45}\right)\times\left(\frac{\lambda}{16}\right) < L < \left(1-\frac{\phi}{45}\right)\times\left(\frac{\lambda}{16}\right) \quad (1')$$

In the expression (1'), $\lambda$ and $\phi$ are identical to $\lambda$ and $\phi$ in the expression (1), respectively.

In the present invention, the maximum emission surface of the emission layer means a region having the highest emission intensity out of the emission layer. Here, the maximum emission surface of the emission layer, which is ideally a surface region having a thickness of zero, is typically a three-dimensional region having some degree of thickness; provided that the thickness described here can be neglected upon consideration of, for example, the optical interference condition of the expression (1). It is to be noted that the position of the maximum emission surface of the emission layer can be appropriately set depending on, for example, a charge balance in the emission layer.

Hereinafter, an organic EL element according to an embodiment of the present invention is described with reference to the drawings. It is to be noted that a widely known technology or publicly known technology in the art is applicable to a portion that is neither particularly shown in the drawings nor particularly described in the following description. In addition, the embodiment to be described below is merely one embodiment of the present invention and the present invention is not limited to the embodiment.

Figure 1A:
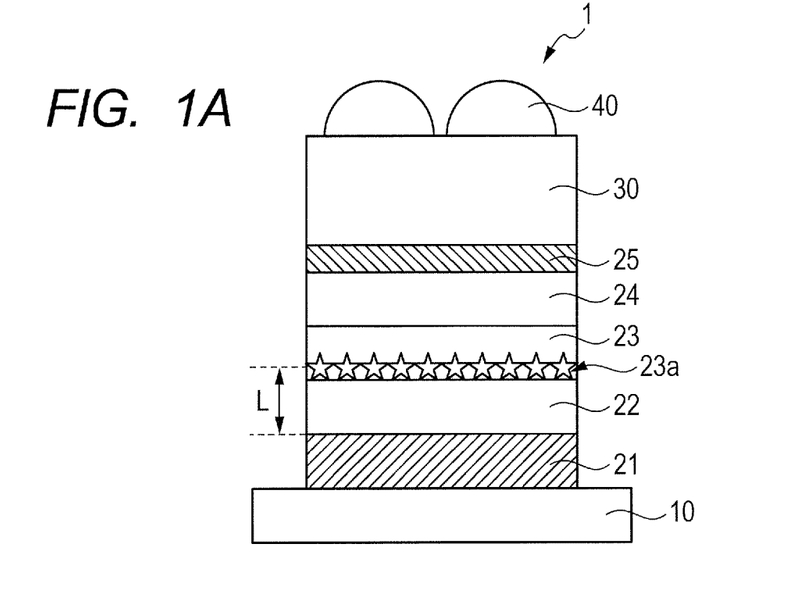
FIGS. 1A and 1B are each a schematic sectional view illustrating an example of an organic EL element according to an embodiment of the present invention, FIG. 1A being a sectional view illustrating a first embodiment and FIG. 1B being a sectional view illustrating a second embodiment.
Figure 1B:
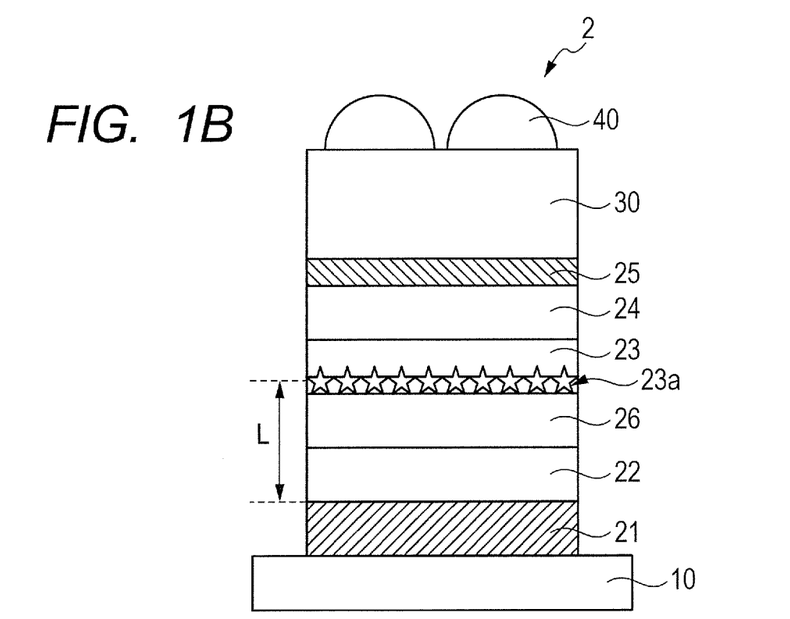

FIGS. 1A and 1B are each a schematic sectional view illustrating an example of an organic EL element according to an embodiment of the present invention, FIG. 1A being a sectional view illustrating a first embodiment and FIG. 1B being a sectional view illustrating a second embodiment. Hereinafter, the first embodiment is described with reference to an organic EL element 1 of FIG. 1A.

First Embodiment

The organic EL element 1 of FIG. 1A is an electronic element obtained by laminating, on a substrate 10, a lower electrode 21, a first charge injection/transport layer 22, an emission layer 23, a second charge injection/transport layer 24, and an upper electrode 25 in the stated order. In addition, in the organic EL element 1 of FIG. 1A, a protective layer 30 and a lens serving as a light extraction member 40 are sequentially formed on the upper electrode 25. An organic EL element 2 of FIG. 1B is of the same construction as that of the organic EL element of FIG. 1A except that a third charge injection/transport layer 26 is formed between the first charge injection/transport layer 22 and the emission layer 23. Hereinafter, the organic EL element 1 of FIG. 1A is mainly described.

In the organic EL element 1 of FIG. 1A, the lower electrode 21 functions as a light reflective electrode. Accordingly, the organic EL element 1 of FIG. 1A is a top emission-type organic EL element in which light is extracted from a side opposite to the substrate 10. It should be appreciated that the present invention is not limited to the aspect, and a bottom emission type in which the upper electrode 25 is a light reflective electrode and light is extracted from a side closer to the substrate 10 is also included in the present invention.

Hereinafter, constituent members for the organic EL element of FIG. 1A are described. It is to be noted that although the following description postulates that the lower electrode 21 and the upper electrode 25 are light transmissive electrode films functioning as an anode and a cathode, respectively, the present invention is not limited to the aspect.

(1) Substrate

Examples of the substrate 10 include various glass substrates and silicon substrates. When the organic EL element of the present invention is utilized as a constituent member for an organic EL display apparatus, a substrate having a driver circuit (not shown) such as a thin-film transistor (TFT), which is formed of a semiconductor such as poly-Si or amorphous silicon (a-Si), formed on a base material is used in some cases.

(2) Lower Electrode (Light Reflective Electrode)

The lower electrode 21 as a light reflective electrode is an electrode layer mainly having a metal reflective film for the purpose of improving the luminous efficiency of the organic EL element. A metal material constituting the metal reflective film is preferably a metal material having a high reflectance. Specific examples of the metal material having a high reflectance include metals such as Al and Ag, and alloys thereof each having a reflectance for visible light of 85% or more. In addition, the lower electrode 21 may be one metal reflective film alone, or may be a laminate of the metal reflective film and a material having a large work function that also serves as a barrier layer for barriering the metal reflective film. A constituent material for the barrier layer is specifically, for example, a transparent conductive layer made of an indium tin oxide, an indium zinc oxide, or the like, a metal material such as Ti, Mo, or W, or a metal oxide such as $MoO_3$.

Here, when the light reflective electrode is constituted only of the metal reflective film, the reflection surface of the light reflective electrode is an interface between the metal reflective film and an organic compound layer to be described later. On the other hand, when the light reflective electrode is constituted of the laminate formed of the metal reflective film and the barrier layer, the reflection surface of the light reflective electrode is an interface between the metal reflective film and the barrier layer. In other words, the reflection surface of the light reflective electrode can be defined as the interface of the metal reflective film on an emission layer side.

(3) Charge Injection/Transport Layer

The charge injection/transport layers (22 and 24) formed between the electrodes (the lower electrode 21 and the upper electrode 25) and the emission layer 23 are classified into two kinds, i.e., a hole injection/transport layer and an electron injection/transport layer depending on the characteristics of charges discharged from the electrodes to the emission layer. Here, the hole injection/transport layer is a concept comprehending a hole injection layer, a hole transport layer, an electron-blocking layer, and the like, and it should be appreciated that a laminate obtained by laminating multiple hole injection layers, multiple hole transport layers, or multiple electron-blocking layers is also included in the concept. In addition, the electron injection/transport layer is a concept comprehending an electron injection layer, an electron transport layer, a hole-blocking layer, and the like, and it should be appreciated that a laminate obtained by laminating multiple electron injection layers, multiple electron transport layers, or multiple hole-blocking layers is also included in the concept.

When the lower electrode 21 and upper electrode 25 in the organic EL element 1 of FIG. 1A are an anode and a cathode, respectively, the first charge injection/transport layer 22 formed between the lower electrode 21 and the emission layer 23 is a hole injection/transport layer. On the other hand, the second charge injection/transport layer 24 formed between the emission layer 23 and the upper electrode 25 is an electron injection/transport layer.

It is to be noted that the first charge injection/transport layer 22 (hole injection/transport layer) in the organic EL element 1 of FIG. 1A has a refractive index lower than that of the adjacent emission layer 23 and hence functions as a low-refractive index layer. It is to be noted that here, a function of the low-refractive index layer is described later. In addition, the first charge injection/transport layer 22 in the organic EL element 1 of FIG. 1A may be a single layer, or may be a laminate formed of two or more layers. Here, when the first charge injection/transport layer 22 is a laminate formed of two or more layers, at least one layer out of the multiple layers constituting the laminate is a low-refractive index layer.

In the present invention, the number of charge injection/transport layers constituting the organic EL element and a material in each charge injection/transport layer are not particularly limited, and a publicly known charge injection material or charge transport material can be used.

(4) Emission Layer

In the organic EL element 1 of FIG. 1A, a light-emitting material as a constituent material for the emission layer 23 may be a fluorescent material or may be a phosphorescent material. In addition, the luminescent color of the emission layer 23 is not particularly limited, and examples thereof include a red color, a green color, a blue color, and a white color.

It is to be noted that the refractive index of the emission layer 23 depends on the luminescent color of the emission layer 23, i.e., the wavelength bandwidth of light output from the emission layer 23. For example, when the wavelength bandwidth of the light output from the emission layer 23 is around 460 nm as a blue wavelength bandwidth, the refractive index of the emission layer 23 is about 1.8 to 1.9. On the other hand, when the wavelength bandwidth of the light output from the emission layer 23 is around 600 nm as a red wavelength bandwidth, the refractive index of the emission layer 23 is about 1.7 to 1.8.

(5) Upper Electrode (Light Transmissive Electrode)

The upper electrode 25 as a light transmissive electrode is a transparent electrode formed of a transparent conductive material or an electrode that is formed of, for example, a semi-transmissive metal film obtained by forming a metal material into a film having a predetermined thickness and that has a transmittance of 60% or more.

When the upper electrode 25 is a light transmissive electrode, a constituent material for the upper electrode 25 is, for example, a transparent electrode material such as an indium zinc oxide or an indium tin oxide. It should be appreciated that a semi-transmissive metal film obtained by forming a metal material such as Ag or Mg, or an alloy obtained by combining two kinds of such metal materials into a film having a predetermined thickness is also included as the upper electrode 25. Here, when the upper electrode 25 is a semi-transmissive metal film, the thickness of the upper electrode 25 is preferably about 10 nm to 20 nm from the viewpoints of its film characteristics and light transmission property.

In addition, an electron injection layer containing an alkali metal is preferably formed between the second charge injection/transport layer 24 (electron injection/transport layer) and the upper electrode 25 from the viewpoint of electron injection property, or an alkali metal is preferably added into the upper electrode 25.

(6) Protective Layer

The protective layer 30 for protecting the organic EL element from oxygen or moisture in the air is formed on the upper electrode 25. The protective layer 30 is preferably a member having a high light transmittance and excellent in moisture resistance, and specific examples thereof include a silicon nitride film and a silicon oxynitride film. However, it is not preferred that the refractive index of the protective layer 30 as a nonmetal member be lower than that of the emission layer 23 because a total reflection interface exists between the emission layer 23 and the light extraction member 40. Therefore, the refractive index of the protective layer 30 is preferably higher than that of the emission layer 23.

(7) Light Extraction Member

The light extraction member 40 is a member formed for the purpose of extracting light trapped in the organic EL element into the air, and for example, a member also having property of changing the exiting direction of light is used. Specific examples thereof include a lens array, a diffraction grating, a scattering layer, and a prism sheet. A member except the members listed above can also be used as long as the member has a function of changing the exiting direction of light. The light extraction member 40 is preferably a condensing member such as a lens array for condensing light emitted from the emission layer.

In addition, when a lens array is formed as the light extraction member 40, a construction in which one organic EL element is provided with multiple lenses is permitted and a construction in which multiple organic EL elements are provided with one lens is also permitted. In addition, one lens constituting the lens array may be provided in correspondence with one organic EL element, and in this case, the central axis of the emission surface of the organic EL element preferably coincides with the central axis of the lens. It is to be noted that when the light extraction member 40 is formed, light trapped and guided in the organic EL element can be extracted into the air but energy converted into a plasmon cannot be extracted as radiated light into the air. In view of the foregoing, optical interference described below is utilized.

(8) Optical Interference

Next, an optical interference condition required of the organic EL element 1 of FIG. 1A is described. It is to be noted that the optical interference condition required in the present invention is an optical interference condition resulting from the emission layer 23 and the lower electrode 21.

As an optical interference condition in a direction from the emission layer 23 to the lower electrode 21, it is important that reflected light in the lower electrode 21 and light traveling from the emission layer 23 to the upper electrode 25 without via the lower electrode 21 be in phase with each other at a desired wavelength. The intensity in a front direction of light having a wavelength λ which one wishes to extract can be strengthened when the optical path L from a maximum emission surface 23a of the emission layer 23 to the surface (reflective metal film surface) of the lower electrode 21 satisfies the following expression (I).

$$L = \left(2m - \frac{\phi}{180}\right) \times \left(\frac{\lambda}{4}\right) \quad (I)$$

In the expression (I), φ represents a phase shift [deg] at the time of reflection and its sign is negative in a phase delay direction.

In the expression (I), m represents 0 or a positive integer. In addition, m is a constant called an order of interference. By the way, when m increases, the narrowing of the bandwidth of a spectrum and fluctuations in view angle characteristics enlarge, and hence m preferably equals 0 in the present invention. When m in the expression (I) equals 0, the expression (I) is transformed into the following expression (II).

$$L = \left(-\frac{\phi}{180}\right) \times \left(\frac{\lambda}{4}\right) \quad (II)$$

φ (phase shift) in each of the expressions (I) and (II), which varies depending on a metal species and the refractive index of a layer positioned on the surface of the metal species, is generally about −100° to −160°.

Figure 2:
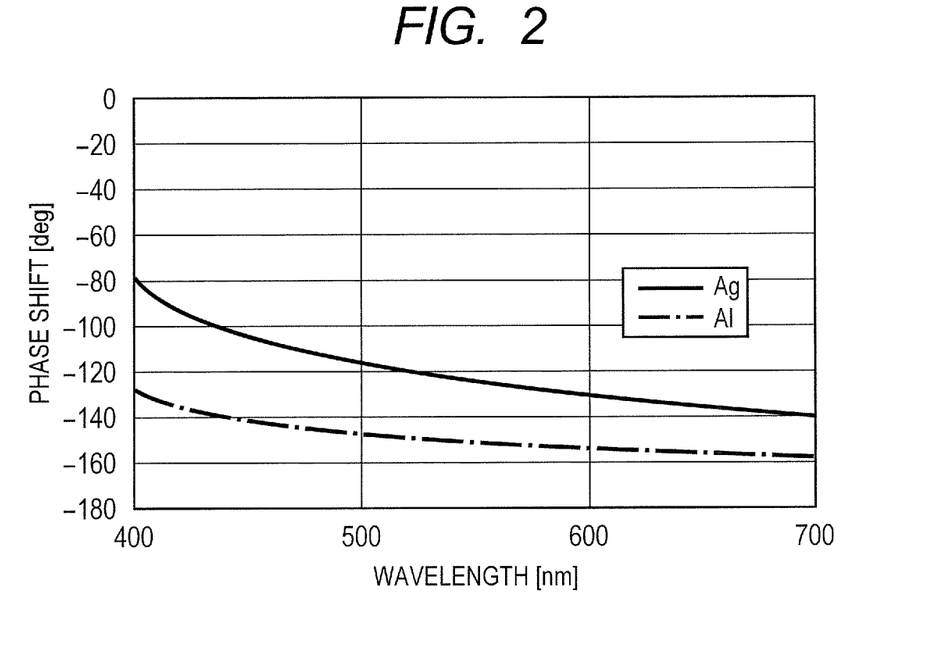
FIG. 2 is a graph showing a phase shift when light incident from an organic compound layer on a light reflective electrode is reflected on the light reflective electrode.

FIG. 2 is a graph showing a phase shift when light incident from an organic compound layer on a light reflective electrode is reflected on the light reflective electrode. It is to be noted that FIG. 2 is also a graph showing the dependence of a phase shift on the wavelength of the light incident on the light reflective electrode. In addition, FIG. 2 is a graph showing a phase shift when light incident from a general organic compound layer (λ=460 nm, n=1.85) on an Ag film or an Al film is reflected.

By the way, the optical path L in each of the expressions (I) and (II) is determined by summing the product of the refractive index (n) and thickness (d) of each layer formed between the maximum emission surface 23a of the emission layer 23 and the reflective metal film. It is to be noted that a phase shift [deg] and reflectance when a thin film is laminated can be determined by general calculation for an optical multilayer thin film with reference to, for example, I. Gontijo et. al., Physical Review B, Vol. 60, (1999), 11564).

In an actual organic EL element, however, in consideration of, for example, view angle characteristics in a trade-off relationship with light extraction efficiency from a front surface, the optical path does not necessarily need to be caused to strictly coincide with a thickness determined from the optical path L through calculation. Specifically, the optical path may have an error of up to ±λ/8 from the thickness value determined by using the optical path L through calculation. Accordingly, the optical path L in the organic EL element of the present invention is required to satisfy the following numerical expression (1).

$$\left(-1 - \frac{\phi}{90}\right) \times \left(\frac{\lambda}{8}\right) < L < \left(1 - \frac{\phi}{90}\right) \times \left(\frac{\lambda}{8}\right) \quad (1)$$

Further, the error range is preferably up to ±λ/16 from the thickness value determined by using the optical path L through calculation. In other words, the optical path L preferably satisfies the following numerical expression (1').

$$\left(-1 - \frac{\phi}{45}\right) \times \left(\frac{\lambda}{16}\right) < L < \left(1 - \frac{\phi}{45}\right) \times \left(\frac{\lambda}{16}\right) \quad (1')$$

In the present invention, in addition to the requirement concerning the optical path L, at least one low-refractive index layer having a refractive index at the maximum peak wavelength of the emission spectrum (of light emitted from the emission layer 23) lower than that of the emission layer 23 by 0.1 or more is formed between the emission layer 23 and the lower electrode 21 (light reflective electrode). Thus, energy loss due to a plasmon can be suppressed. As a result, the quantity of light that reaches the light extraction member for changing the exiting direction of light increases, and hence an effect (synergistic effect) combined with an effect when the light extraction member is formed is exhibited. Thus, an organic EL element having efficiency higher than the conventional one is obtained.

Here, a setting condition for the optical path in this embodiment is discussed below by taking, as a specific example, an organic EL element in which two hole injection/transport layers (an HTL1 on a light reflective electrode side and an HTL2 on an emission layer side) are formed between an anode as a light reflective electrode and an emission layer. The following description is also applicable to an organic EL element in which two electron injection/transport layers are formed between a cathode as a light reflective electrode and an emission layer. In addition, in the following description, the discussion is performed based on conditions described below.

Lower electrode: A light reflective electrode formed of an Ag film

The refractive indices of the HTL1 and the HTL2 are different from each other.

Maximum peak wavelength (λ) of an emission spectrum: 460 nm (blue emission)

Upper electrode: A light transmissive electrode formed of an Ag film having a thickness of 12 nm Protective layer: A refractive index is 1.9 (larger than the refractive index of the emission layer).

Here, as shown in FIG. 2, the phase shift φ of the Ag film as the lower electrode (light reflective electrode) at the time of reflection is nearly equal to −105° at λ=460 nm. Therefore, the L is determined to be about 67 nm by substituting the φ value into the expression (II). It is to be noted that the L value (about 67 nm) is the so-called optimum value.

Here, suppose that an emission region in the emission layer localizes toward the hole injection/transport layer (HTL2) and the maximum emission surface of the emission layer is positioned at 2 nm from the interface of the emission layer on the light reflective electrode side. In that case, the total of the optical paths of the HTL1 and the HTL2 is about 64 nm because the optimum value for the L determined in advance by utilizing the expression (II) is about 67 nm.

Figure 3:
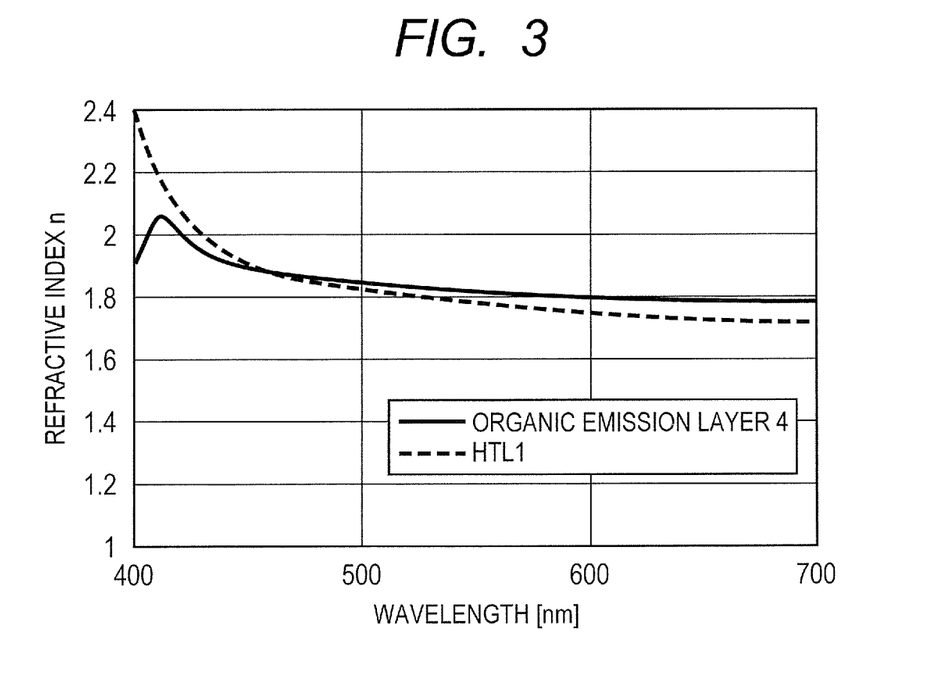
FIG. 3 is a graph showing the wavelength dependence of the refractive index of each of an emission layer and an HTL1.

Described below is the result of the analysis of a relationship between: the thickness of the HTL1 and the thickness of the HTL2 (low-refractive index layer); and the distribution proportion of each optical mode. FIG. 3 is a graph showing the wavelength dependence of the refractive index of each of the emission layer and the HTL1. As shown in FIG. 3, the refractive index of each of the emission layer and the HTL1 at a wavelength of 460 nm is about 1.85. It is to be noted that the emission region in the emission layer is assumed to localize toward the hole injection/transport layer (HTL2) and the maximum emission surface in the emission layer is assumed to be positioned at 2 nm from the interface of the emission layer on the side closer to the hole injection/transport layer (HTL2). In addition, a simulation was performed by the same approach as that of each of S. Nowy et. al., Journal of Applied Physics 104, 123109 (2008) and I. Gontijo et. al., Physical Review B, Vol. 60, (1999), 11564).

Figure 4:
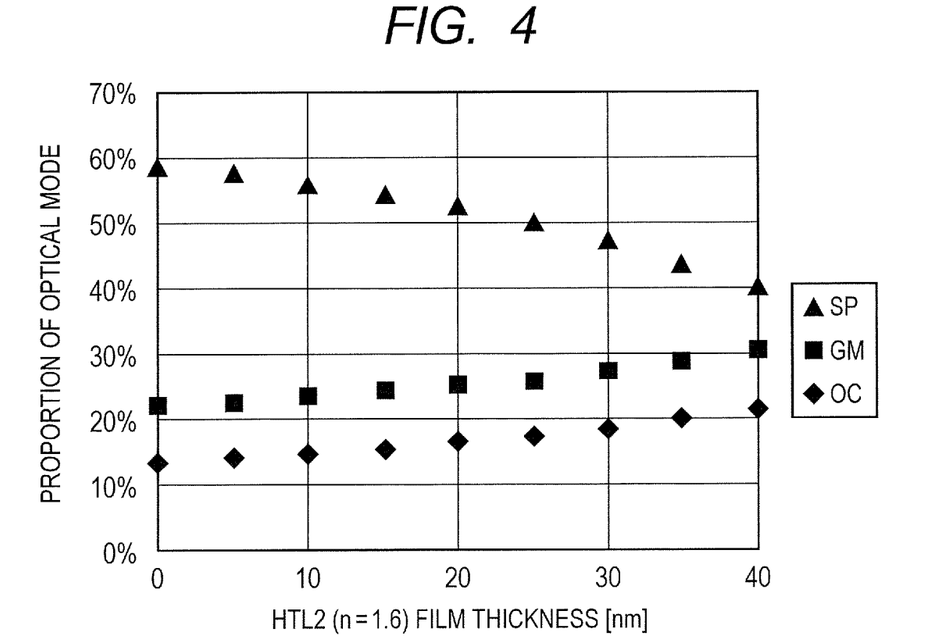
FIG. 4 is a graph showing a relationship between the thickness of an HTL2 and the proportion of an optical mode.

FIG. 4 is a graph showing a relationship between the thickness of the HTL2 and the proportion of an optical mode. It is to be noted that the graph of FIG. 4 is a simulation when the refractive index of the HTL2 is set to 1.60. In addition, the case where a value indicated by the axis of abscissa in the graph of FIG. 4 is 0 states that the thickness of the HTL2 is 0 nm, which means that the HTL2 is absent as a constituent member for the organic EL element. That is, the case where the value indicated by the axis of abscissa is 0 shows an aspect in which only the HTL1 is formed between the light reflective electrode (anode) and the emission layer.

As shown in FIG. 4, optical modes are classified into three kinds, i.e., an SP, a GM, and an OC. Here, the OC (out coupling) represents light extraction efficiency into the air when no light extraction member is formed. The GM (guide mode) represents the proportion of light guided in the organic EL element by total reflection at an air interface out of light incident into the protective layer. The SP (surface plasmon) represents the proportion of energy coupling to plasmons on metal surfaces in the lower electrode and the upper electrode. It is to be noted that the total of the proportions of those three optical modes does not become 100%, more specifically, is less than 100%. It is because light output from the emission layer contains light within a critical angle, the light being absorbed in the element before being extracted into the air, that the total of the proportions of the three optical modes does not become 100% as described above.

As shown in FIG. 4, the case where the thickness of the HTL2 is 0 nm means that a layer between the lower electrode and the emission layer is the HTL1, which has substantially the same refractive index as that of the emission layer, alone. When the thickness of the HTL2 is 0 nm, the proportion of each optical mode is as follows: SP: about 60%, GM: about 22%, OC: about 14%. The foregoing means that one half or more of emission energy generated from an exciton is converted into coupling by a plasmon. Therefore, even when all light in the GM mode can be extracted into the air by introducing a light extraction member such as a lens, the maximum of the light extraction efficiency becomes only about 36%.

On the other hand, as can be seen from FIG. 4, when the thickness of the HTL2 (low-refractive index layer) increases, the proportion of the SP mode reduces by a certain proportion, and the proportions of both the GM and OC modes each increase by a certain proportion, in correspondence with the increase. This is because of the following reason: when the refractive index of the surface of the light reflective electrode (metal electrode) reduces, the wavenumber of a plasmon reduces, and hence the rate of coupling to the plasmon reduces and the proportion of coupling to the SP mode also reduces (see I. Gontijo et. al., Physical Review B, Vol. 60, (1999), 11564). In addition, the reduction amount of the proportion of the SP mode is allocated to the OC mode and the GM mode, and hence the placement of a low-refractive index layer between the emission layer and the light reflective electrode increases the OC mode and GM mode that are important from the viewpoint of the light extraction efficiency. When the thickness of the HTL2 in FIG. 4 is 40 nm (the thickness of the HTL1 is 0 nm), the distributions of the respective optical modes are about 40% (SP mode), about 31% (GM mode), and about 22% (OC mode), respectively. In this case, if it is assumed that light in the GM mode can be extracted into the air to the extent possible by utilizing a light extraction member such as a lens, the maximum of the light extraction efficiency is about 53%.

In other words, the employment of the technology enables the allocation of energy to be allocated to the SP mode that has heretofore been unable to extract into the air to the OC mode and GM mode that can be extracted with a light extraction member.

Table 1 below shows the light extraction efficiency (in particular, a light extraction-improving effect) in this embodiment.

TABLE 1

|  | Without low-refractive index layer | With low-refractive index layer |
|---|---|---|
| Without light extraction member | 14% | 22% |
| With light extraction member | 36% | 53% |

(Note) The refractive index of the HTL2 is 1.6 at λ = 460 nm.

In Table 1, the light extraction efficiency with a light extraction unit is a value obtained by summing the proportion of the OC mode and the proportion of the GM mode on the assumption that all light in the GM mode can be extracted into the air. On the other hand, the proportion of the OC mode is adopted as it is as the light extraction efficiency without a light extraction unit.

As can be seen from Table 1, an efficiency-improving effect by the light extraction member is 22% (36%−14%=22%) and an efficiency-improving effect by the low-refractive index layer is 8% (22%−14%=8%). In addition, as shown in Table 1, an efficiency-improving effect when the light extraction member and the low-refractive index layer are combined is 39% (53%−14%=39%). The value is larger than a value (30%) obtained by simply summing the respective effects. The foregoing shows that the light extraction efficiency-improving effect by the combination of the light extraction member and the low-refractive index layer is not a mere sum of the light extraction efficiency-improving effect by the light extraction member and the light extraction efficiency-improving effect by the low-refractive index layer. The foregoing is caused by a synergistic effect resulting from the GM mode. That is, a GM component increased by the introduction of the low-refractive index layer does not contribute to the increase of an OC component alone but is newly transformed into the OC component by the light extraction member. The mode transformation (GM→OC) improves the light extraction efficiency, whereby the luminous efficiency of the element itself improves.

Figure 5:
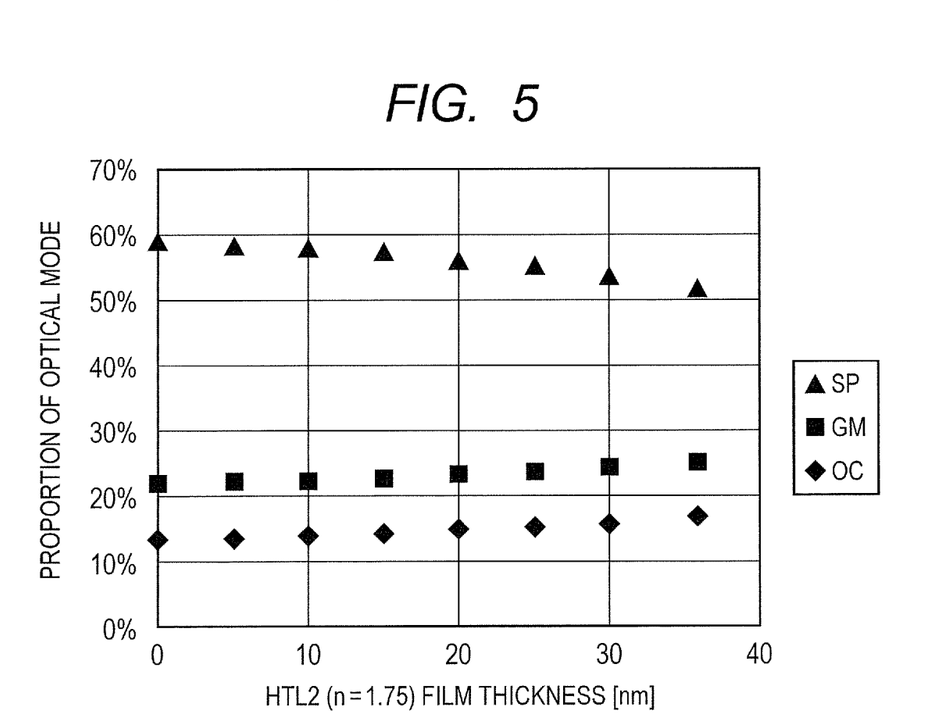
FIG. 5 is a graph showing a relationship between the thickness of the HTL2 and the proportion of the optical mode.

Next, similar calculation was performed in the case where the refractive index of the HTL2 was lower than that of the emission layer by 0.1, i.e., was 1.75. FIG. 5 is a graph showing a relationship between the thickness of the HTL2 and the proportion of an optical mode. It is to be noted that the graph of FIG. 5 is a simulation when the refractive index of the HTL2 is set to 1.75. An evaluation for light extraction efficiency is performed based on the simulation. Table 2 below shows the results of the evaluation.

TABLE 2

|  | Without low-refractive index layer | With low-refractive index layer |
|---|---|---|
| Without light extraction member | 14% | 17% |
| With light extraction member | 36% | 42% |

(Note) The refractive index of the HTL2 is 1.75 at λ = 460 nm.

As can be seen from FIG. 5, even in the case where the refractive index of the HTL2 is 1.75, as in the case where the refractive index of the HTL2 is 1.6, when the thickness of the low-refractive index layer (HTL2) increases, the respective proportions of the OC mode and the GM mode increase while the proportion of the SP mode reduces. In addition, as can be seen from Table 2, an efficiency-improving effect by the light extraction member is 22% (36%−14%=22%) and an efficiency-improving effect by the low-refractive index layer is 3% (17%−14%=3%). In addition, as shown in Table 2, an efficiency-improving effect when the light extraction member and the low-refractive index layer are combined is 28% (42%−14%=28%). The value is larger than a value (25%) obtained by simply summing the respective effects.

Figure 6:
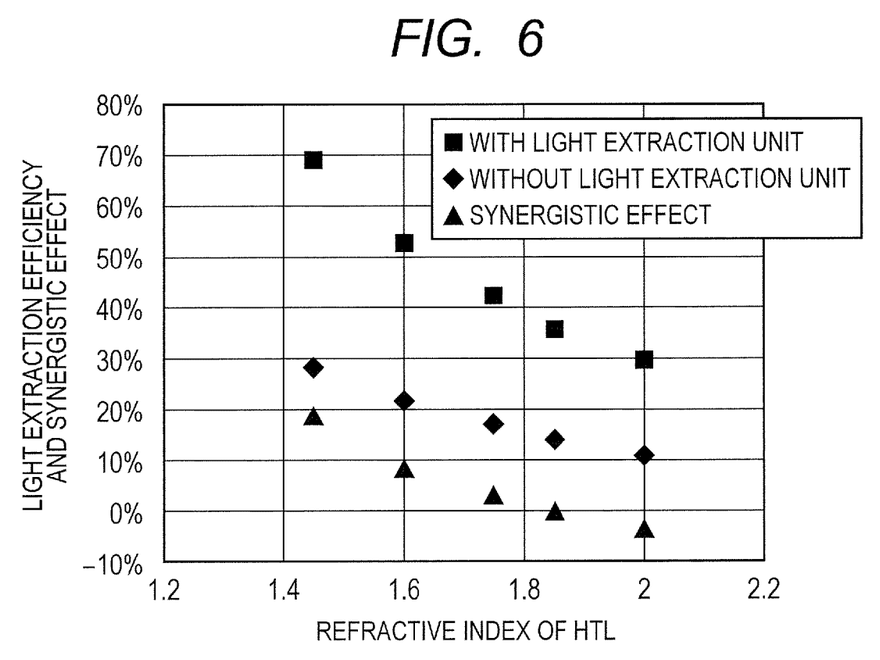
FIG. 6 is a graph showing a relationship between the refractive index of an HTL, and light extraction efficiency and a synergistic effect thereof.

FIG. 6 is a graph showing a relationship between the refractive index of an HTL, and light extraction efficiency and a synergistic effect thereof. It is to be noted that the HTL shown in FIG. 6 is the same as the HTL2 in each of FIG. 4 and FIG. 5. In addition, the graph of FIG. 6 is targeted for an organic EL element in which only the HTL is formed between a lower electrode (light reflective electrode) and an emission layer.

In addition, in FIG. 6, the light extraction efficiency with the light extraction member is a value obtained by summing the proportions of the OC mode and the GM mode from the viewpoint that all light in the GM mode can be extracted into the air. In addition, a difference between a light extraction efficiency value when the light extraction member and the low-refractive index layer are combined, and a value obtained by simply summing the respective effects is separately plotted as a synergistic effect. FIG. 6 shows the light extraction efficiency when the refractive index of the entire HTL layer is 1.45, 1.6, 1.75, 1.85, or 2.0. As can be seen from FIG. 6, the light extraction efficiency value and the synergistic effect enlarge as the refractive index of the HTL reduces.

In addition, FIG. 6 shows that the use of a layer having a refractive index lower than that of a conventional and general organic layer as the HTL improves the light extraction efficiency. Specifically, the refractive index of the HTL is preferably lower than the refractive index of the organic compound layer that has heretofore been used by 0.1 or more because the light extraction efficiency additionally improves and the synergistic effect by the adoption of the light extraction member enlarges.

As can be seen from the foregoing, it is preferred that in the present invention, the refractive index of the low-refractive index layer be made as low as possible and its thickness be made as large as possible. It is to be noted that when the low-refractive index layer is a hole injection/transport layer, a hole transport material having a low refractive index is, for example, Compound 2 shown below.

Compound 2

Compound 2 is a compound in which a tert-butyl group as a bulky functional group is introduced to a terminal of a triarylamine-based skeleton having hole transport property. When a bulky tert-butyl group is introduced, the film density of a formed film reduces and hence the refractive index of the film itself can be reduced. In addition, the refractive index-reducing effect can be expected from, for example, the introduction of a long-chain alkyl group to the terminal or the introduction of a functional group containing fluorine thereto. It is to be noted that the method is applicable even when a charge injection/transport layer formed between the light reflective electrode (the lower electrode 21) and the emission layer 23 is an electron injection/transport layer.

Alternatively, a method involving doping a charge injectable/transportable material such as a hole transportable material with a low-refractive index material is available. When the method is employed, the low-refractive index material may be an organic material or may be an inorganic material. A film obtained by mixing, into Compound 1 (hole transportable material) shown below, Compound 2 or lithium fluoride as the low-refractive index material is described as an example.

Compound 1

The refractive index of Compound 1 at a wavelength of 460 nm is 1.90. However, the refractive index is quantitatively changed (reduced) by doping the low-refractive index material (Compound 2 or LiF) as shown in Table 3 and Table 4.

TABLE 3

| Compound 1 (mass %) | Compound 2 (mass %) | Refractive index |
|---|---|---|
| 100 | 0 | 1.90 |
| 80 | 20 | 1.85 |
| 60 | 40 | 1.80 |
| 40 | 60 | 1.75 |
| 20 | 80 | 1.70 |
| 0 | 100 | 1.65 |

TABLE 4

| Compound 1 (mass %) | LiF (mass %) | Refractive index |
|---|---|---|
| 100 | 0 | 1.90 |
| 80 | 20 | 1.81 |
| 60 | 40 | 1.72 |
| 40 | 60 | 1.62 |
| 20 | 80 | 1.51 |
| 0 | 100 | 1.40 |

As described above, the method involving doping the charge injectable/transportable material with the low-refractive index material can quantitatively change the refractive index, and hence the refractive index of the charge injection/transport layer can be quantitatively reduced. It is to be noted that the method for the doping with the low-refractive index material can be appropriately selected depending on a method of forming a layer of interest. Specifically, when the layer is formed by a dry film-forming method such as a vapor deposition method, the formation can be performed by an ordinary codeposition method. On the other hand, when the layer is formed by a wet film-forming method such as an application method, a solution obtained by mixing a constituent material for the layer at a predetermined ratio with a solvent has only to be formed into a film by the application method or the like.

By the way, the charge injection/transport layer serving as the low-refractive index layer may be formed by using a fluorine-based polymer such as polytetrafluoroethylene. The layer formed of the fluorine-based polymer is formed by the wet film-forming method such as the application method and a low-refractive index film having a refractive index around 1.30 can be formed from the polymer. It is to be noted that a substantial lower limit for the refractive index of the low-refractive index layer may be about 1.3 because there may be no solid material having a refractive index lower than that of the fluorine-based polymer.

Second Embodiment

Next, the second embodiment is described. The second embodiment relates to such an organic EL element that light to be extracted is white light.

In this embodiment, a publicly known material can be used as a constituent material for the emission layer 23. In addition, the emission layer in this embodiment may be a laminate formed of multiple layers or may be a single layer in which multiple light-emitting dopants are mixed. In order that the organic EL element may be caused to output white light, light output from the emission layer is required to have predetermined emission intensities in: the vicinity of 600 nm as a red wavelength bandwidth; the vicinity of 530 nm as a green wavelength bandwidth; and the vicinity of 460 nm as a blue wavelength bandwidth. By the way, white light generally has one or more emission peaks in a visible wavelength bandwidth (400 nm to 700 nm). In this embodiment, however, description is given by taking white light having the maximum emission peak at λ=540 nm as a specific example.

Here, a setting condition for the optical path in this embodiment is discussed below by taking, as a specific example, an organic EL element in which two hole injection/transport layers (an HTL1 on a light reflective electrode side and an HTL2 on an emission layer side) are formed between an anode as a light reflective electrode and an emission layer. The following description is also applicable to an organic EL element in which two electron injection/transport layers are formed between a cathode as a light reflective electrode and an emission layer. In addition, in the following description, the discussion is performed based on conditions described below.

Lower electrode: A light reflective electrode formed of an Al film
The refractive indices of the HTL1 and the HTL2 are different from each other.
Maximum peak wavelength (λ) of an emission spectrum: 540 nm (white emission)
Upper electrode: A light transmissive electrode formed of an indium zinc oxide film
Protective layer: A refractive index is 1.9 (larger than the refractive index of the emission layer).

Here, as shown in FIG. 2, the phase shift φ of the Al film as the lower electrode (light reflective electrode) at the time of reflection is nearly equal to −150° at λ=460 nm. Therefore, the L is determined to be about 112 nm by substituting the φ value into the expression (II). It is to be noted that the L value (about 112 nm) is the so-called optimum value.

Described below is the result of the analysis of a relationship between: the thickness of the HTL1 (low-refractive index layer) and the thickness of the HTL2; and the distribution proportion of each optical mode. It is to be noted that the emission region in the emission layer is assumed to localize toward the hole injection/transport layer (HTL2) and the maximum emission surface in the emission layer is assumed to be positioned at 2 nm from the interface of the emission layer on the side closer to the hole injection/transport layer (HTL2). In addition, a simulation was performed by the same approach as that of each of S. Nowy et. al., Journal of Applied Physics 104, 123109 (2008) and I. Gontijo et. al., Physical Review B, Vol. 60, (1999), 11564).

Figure 7:
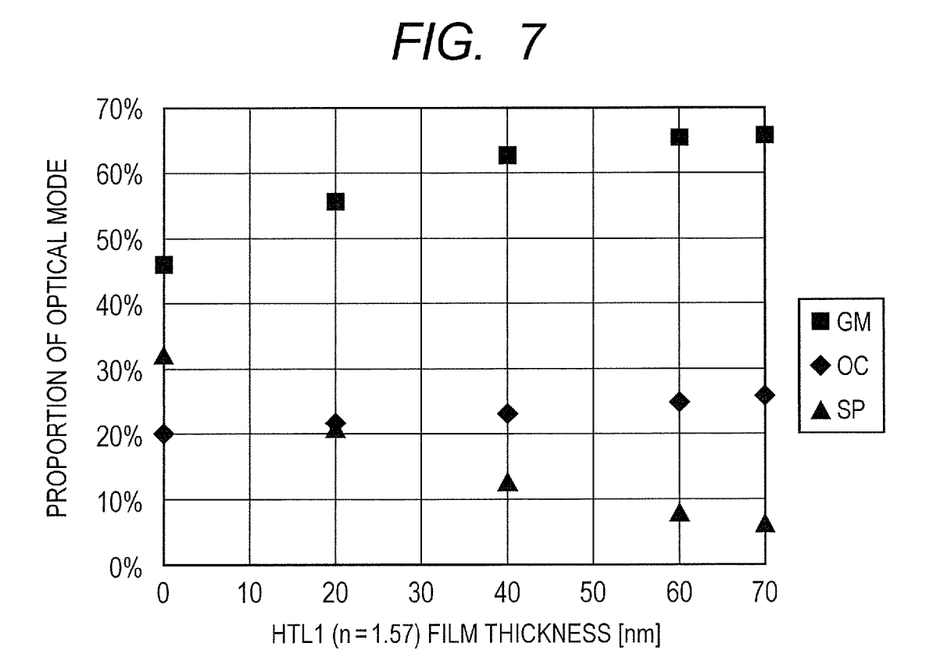
FIG. 7 is a graph showing a relationship between the thickness of the HTL1 and the proportion of an optical mode.

FIG. 7 is a graph showing a relationship between the thickness of the HTL1 and the proportion of an optical mode. It is to be noted that the graph of FIG. 7 is a simulation when the refractive index of the HTL1 is set to 1.57. In addition, the case where a value indicated by the axis of abscissa in the graph of FIG. 7 is 0 states that the thickness of the HTL1 is 0 nm, which means that the HTL1 is absent as a constituent member for the organic EL element. That is, the case where the value indicated by the axis of abscissa is 0 shows an aspect in which only the HTL2 is formed between the light reflective electrode (anode) and the emission layer. In FIG. 7, the respective thicknesses of the HTL1 and the HTL2 are adjusted so that the optical path L may become about 112 nm.

As shown in FIG. 7, the case where the thickness of the HTL2 is 0 nm means that a layer between the lower electrode and the emission layer is the HTL2, which has substantially the same refractive index as that of the emission layer, alone. When the thickness of the HTL1 is 0 nm, the proportion of each optical mode is as follows: SP: about 32%, GM: about 46%, OC: about 20%. The foregoing means that about ⅓ of emission energy generated from an exciton is converted into coupling by a plasmon. By the way, the proportion of coupling to the plasmon in this embodiment is relatively small as compared with that in the first embodiment (blue organic EL element) because light emission at shorter wavelengths tends to have a larger amount of the coupling to the plasmon.

In addition, FIG. 7 shows that increasing the thickness of the HTL1 (low-refractive index layer) reduces the proportion of the SP mode, and increases the proportions of the GM mode and the OC mode. Therefore, the thickness of the low-refractive index layer is suitably as large as possible. In the case of this embodiment, however, the effect of the present invention is sufficiently expressed when one half or more of the layers formed between the lower electrode (light reflective electrode) and the emission layer are the low-refractive index layer from the viewpoint of the thickness.

Table 5 below shows the light extraction efficiency (in particular, a light extraction-improving effect) in this embodiment.

TABLE 5

|  | Without low-refractive index layer | With low-refractive index layer (40 nm) | With low-refractive index layer (70 nm) |
| --- | --- | --- | --- |
| Without light extraction member | 20% | 23% | 26% |
| With light extraction member | 66% | 86% | 92% |

(Note)
The refractive index of the HTL1 is 1.57 at λ = 540 nm.

In Table 5, the light extraction efficiency with a light extraction unit is a value obtained by summing the proportion of the OC mode and the proportion of the GM mode on the assumption that all light in the GM mode can be extracted into the air. On the other hand, the proportion of the OC mode is adopted as it is as the light extraction efficiency without a light extraction unit. It is to be noted that a state where the thickness of the HTL1 (low-refractive index layer) in this embodiment is 70 nm means that a layer formed between the lower electrode (light reflective electrode) and the emission layer is the HTL1 alone.

As can be seen from Table 5, an efficiency-improving effect by the light extraction member is 46% (66%−20%=46%) and an efficiency-improving effect by the provision of the low-refractive index layer having a thickness of 70 nm is 6% (26%−20%=6%). In addition, as shown in Table 5, when the low-refractive index layer having a thickness of 70 nm is formed, the efficiency-improving effect by the light extraction member is 66% (92%−26%=66%). It is therefore understood from Table 5 that the luminous efficiency of the organic EL element of the present invention is higher than the conventional one by virtue of a synergistic effect of a plasmon-suppressing effect by the low-refractive index layer and a guided light-extracting effect by the light extraction member. A luminous efficiency-improving effect by the introduction of the light extraction member is particularly large.

By the way, when the thickness of the HTL1 is set to 40 nm, the efficiency-improving effect by the light extraction member is 63% (86%−23%=63%). The degree of this effect (the luminous efficiency-improving effect by the light extraction member) is sufficiently large as compared with that in the case where the low-refractive index layer is absent, and the effect is substantially comparable to that in the case where the thickness of the HTL1 is set to 70 nm. Therefore, it can be said that the effect of the present invention is sufficiently expressed when the thickness of the low-refractive index layer formed between the lower electrode and the emission layer is one half or more of the distance between the lower electrode and the emission layer.

Figure 8:
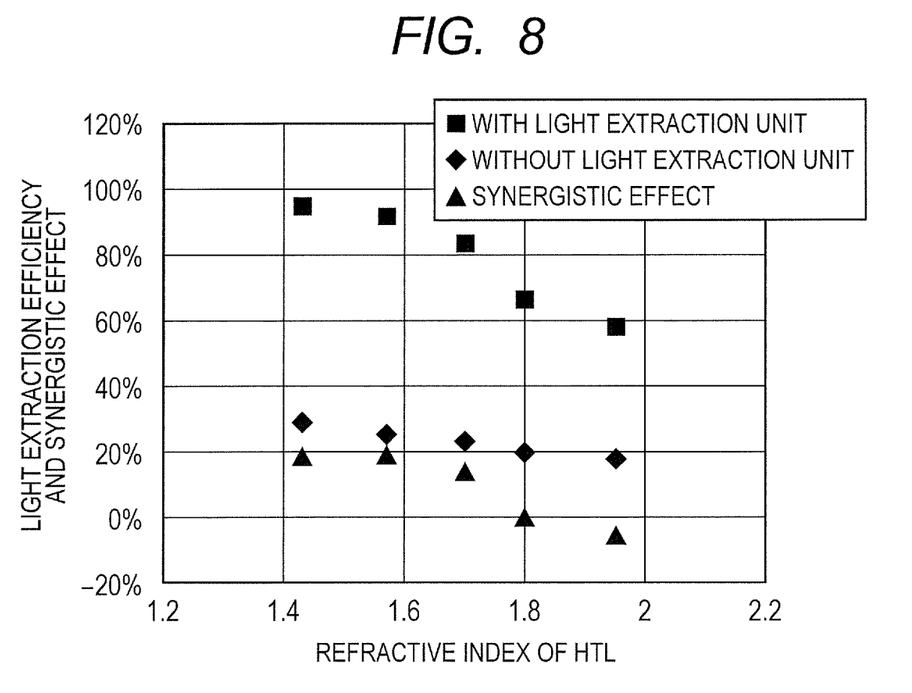
FIG. 8 is a graph showing a relationship between the refractive index of the HTL1, and light extraction efficiency and a synergistic effect thereof.

FIG. 8 is a graph showing a relationship between the refractive index of an HTL, and light extraction efficiency and a synergistic effect thereof. It is to be noted that the HTL shown in FIG. 8 is the same as the HTL1 in FIG. 7. In addition, the graph of FIG. 8 is targeted for an organic EL element in which only the HTL is formed between a lower electrode (light reflective electrode) and an emission layer.

In addition, in FIG. 8, the light extraction efficiency with the light extraction member is a value obtained by summing the proportions of the OC mode and the GM mode from the viewpoint that all light in the GM mode can be extracted into the air. In addition, a difference between a light extraction efficiency value when the light extraction member and the low-refractive index layer are combined, and a value obtained by simply summing the respective effects is separately plotted as a synergistic effect. FIG. 8 shows the light extraction efficiency when the refractive index of the entire HTL layer is 1.45, 1.6, 1.75, 1.85, or 2.0. As can be seen from FIG. 8, the light extraction efficiency value and the synergistic effect enlarge as the refractive index of the HTL reduces.

In addition, FIG. 8 shows that the use of a layer having a refractive index lower than that of a conventional and general organic layer as the HTL improves the light extraction efficiency. Specifically, the refractive index of the HTL is preferably lower than the refractive index of the organic compound layer that has heretofore been used by 0.1 or more because the light extraction efficiency additionally improves and the synergistic effect by the adoption of the light extraction member enlarges.

Although the foregoing embodiment is targeted for an organic EL element of a top emission construction, the present invention can also be targeted for such an organic EL element of a bottom emission construction that light is extracted from a substrate side.

In the organic EL element of the bottom emission construction, a light extraction unit is formed on the light extraction side of a substrate (side on which no constituent member for the organic EL element is formed). In such case, the refractive index of the substrate as a nonmetal member is preferably higher than the refractive index of an emission layer in order that no total reflection interface may be present between the emission layer and the light extraction unit. In addition, the present invention is also effective in a tandem-type organic EL element in which two emission layers are prepared and a layer for generating a charge is formed between these emission layers. In general, in the tandem type, the emission layer closer to a light reflective electrode satisfies the expression (1), and hence the effect of the present invention is obtained by placing a low-refractive index layer between the emission layer and the light reflective electrode.

It is to be noted that in the case where white emission is used like this embodiment, when an emission intensity in a specific wavelength bandwidth strengthens, a desired white color is not obtained and hence an interference effect is preferably caused to act on a wide bandwidth. As described in the foregoing, the present invention adopting the order of interference m=0 can suppress the narrowing of the bandwidth of a spectrum due to interference and the degradation of view angle characteristics. Therefore, the present invention is particularly effective for an organic EL element that emits white light and is hence an invention suitable in an application using white emission.

In the present invention, the thickness of the low-refractive index layer is preferably as large as possible to such an extent that the expression (1) is satisfied. However, it can be said that the effect of the present invention is exhibited when the thickness of the low-refractive index layer is set so that the layer may have an optical thickness equal to or more than one half of the optical path between the emission layer and the light reflective electrode. In addition, the refractive index of an organic compound layer that has heretofore been in common use is substantially equal to the value shown in FIG. 2. Accordingly, as a guideline, the refractive index of the low-refractive index layer is 1.75 or less at 460 nm, 1.7 or less at 540 nm, and 1.65 or less at 600 nm. It is to be noted that the refractive index can be measured by employing a publicly known technology such as spectroscopic ellipsometry.

(Application of Organic EL Element)

The organic EL element of the present invention can be used as a constituent member for a display apparatus or lighting apparatus. In addition, applications thereof include an exposure light source for an electrophotographic image forming apparatus, a backlight for a liquid crystal display apparatus, and a light-emitting apparatus including a color filter in a white light source. The color filter is, for example, a filter through which light beams of three colors, i.e., red, green, and blue colors are transmitted.

A display apparatus of the present invention includes the organic EL element of the present invention in its display portion. It is to be noted that the display portion includes multiple pixels.

In addition, the pixels each include the organic EL element of the present invention and a transistor as an example of an active element (switching element) or amplifier element for controlling an emission luminance, and the anode or cathode of the organic EL element and the drain electrode or source electrode of the transistor are electrically connected to each other. Here, the display apparatus can be used as an image display apparatus for a PC or the like. The transistor is, for example, a TFT element and the TFT element is formed on, for example, the insulating surface of a substrate. In addition, the TFT element preferably includes an electrode formed of a transparent oxide semiconductor.

The display apparatus may be an image information processing apparatus including an image input portion for inputting image information from, for example, an area CCD, a linear CCD, or a memory card, the apparatus displaying an input image on its display portion.

In addition, the display portion of an imaging apparatus or an inkjet printer may have a touch panel function. The driving system of the touch panel function is not particularly limited.

An imaging apparatus of the present invention is an apparatus including the display apparatus of the present invention and an imaging element, and the display apparatus of the present invention is included in a display portion for displaying information concerning an image photographed with the imaging element.

In addition, the display apparatus may be used in the display portion of a multifunction printer.

A lighting apparatus is an apparatus for lighting, for example, the inside of a room. The lighting apparatus may emit light of a white color (having a color temperature of 4,200 K), a daylight color (having a color temperature of 5,000 K), or any other color ranging from blue to red colors.

A lighting apparatus of the present invention includes the organic EL element of the present invention, and an AC/DC converter circuit (circuit for converting an AC voltage into a DC voltage) connected to the organic EL element and supplying a driving voltage to the organic EL element. It is to be noted that the lighting apparatus may further include a color filter.

An image forming apparatus of the present invention is an image forming apparatus including: a photosensitive member; a charging portion for charging the surface of the photosensitive member; an exposure portion for exposing the photosensitive member to form an electrostatic latent image; and a developing unit for developing the electrostatic latent image formed on the surface of the photosensitive member. Here, the exposure unit to be included in the image forming apparatus includes the organic EL element of the present invention.

In addition, the organic EL element of the present invention can be used as a constituent member (light-emitting member) for an exposure machine for exposing a photosensitive member. The exposure machine including the organic EL element of the present invention is, for example, an exposure machine in which the organic EL elements of the present invention are placed along a predetermined straight direction to form a line.

Figure 9:
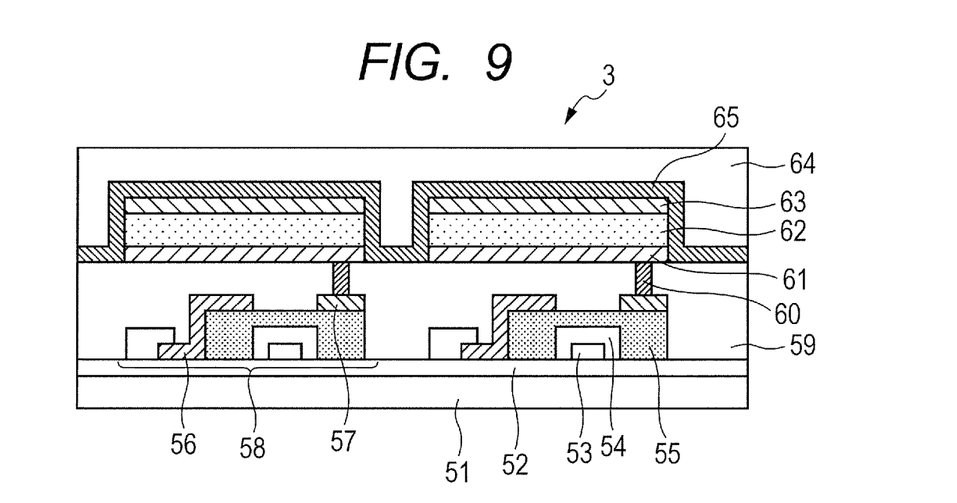
FIG. 9 is a schematic sectional view illustrating an example of a display apparatus including an organic EL element and a switching element connected to the organic EL element.

Next, the display apparatus of the present invention is described with reference to the drawings. FIG. 9 is a schematic sectional view illustrating an example of a display apparatus including an organic EL element and a switching element connected to the organic EL element. It is to be noted that the organic EL element of the present invention is used as an organic EL element constituting a display apparatus 3 of FIG. 9.

The display apparatus 3 of FIG. 9 includes a substrate 51 such as glass and a moisture-resistant film 52 for protecting a TFT element 58 serving as a switching element or an organic compound layer, the film being formed on the substrate. In addition, reference symbol 53 represents a metal gate electrode 53, reference symbol 54 represents a gate insulating film 54, and reference symbol 55 represents a semiconductor layer.

The TFT element 58 includes the semiconductor layer 55, a drain electrode 56, and a source electrode 57. An insulating film 59 is formed on the TFT element 58. An anode 61 constituting the organic EL element and the source electrode 57 are connected to each other through a contact hole 60.

It is to be noted that a system for electrical connection between the electrode (anode or cathode) in the organic EL element and the electrode (source electrode or drain electrode) in the TFT is not limited to an aspect illustrated in FIG. 9. In other words, one of the anode and the cathode, and one of the source electrode and drain electrode of the TFT element have only to be electrically connected to each other.

Although the display apparatus 3 of FIG. 9 is illustrated as if a multilayer organic compound layer were one layer, an organic compound layer 62 may be multiple layers. A first protective layer 64 and second protective layer 65 for suppressing the degradation of the organic EL element are formed on a cathode 63.

When the display apparatus 3 of FIG. 9 is a display apparatus that emits white light, an emission layer in the organic compound layer 62 in FIG. 9 may be a layer obtained by mixing a red-light-emitting material, a green-light-emitting material, and a blue-light-emitting material. In addition, the layer may be a laminated emission layer obtained by laminating a layer formed of the red-light-emitting material, a layer formed of the green-light-emitting material, and a layer formed of the blue-light-emitting material. Alternatively, the following aspect is also permitted: the layer formed of the red-light-emitting material, the layer formed of the green-light-emitting material, and the layer formed of the blue-light-emitting material are laterally arranged to form domains in one emission layer.

Although a transistor is used as the switching element in the display apparatus 3 of FIG. 9, an MIM element may be used instead of the transistor as the switching element.

In addition, the transistor to be used in the display apparatus 3 of FIG. 9 is not limited to a transistor using a single-crystal silicon wafer and may be a thin-film transistor having an active layer on the insulating surface of a substrate. A thin-film transistor using single-crystal silicon as its active layer, a thin-film transistor using non-single-crystal silicon such as amorphous silicon or microcrystalline silicon as its active layer, or a thin-film transistor using a non-single-crystal oxide semiconductor such as an indium zinc oxide or an indium gallium zinc oxide as its active layer is also permitted. It is to be noted that a thin-film transistor is also referred to as "TFT element."

The transistor in the display apparatus 3 of FIG. 9 may be formed in a substrate such as an Si substrate. The phrase "formed in the substrate" as used herein means that the transistor is produced by processing the substrate such as an Si substrate itself. In other words, the presence of the transistor in the substrate can be viewed as follows: the substrate and the transistor are integrally formed.

Whether or not the transistor is provided in the substrate is selected depending on definition. In the case of, for example, a definition of about QVGA per inch, an organic EL element is preferably provided in an Si substrate.

As described above, an image having good quality can be stably displayed for a long time period by driving the display apparatus using the organic EL element of the present invention.

EXAMPLE 1

An organic EL element illustrated in FIG. 1A was produced by the following method. It is to be noted that the organic EL element to be produced in this example is a blue organic EL element. In addition, part of the compounds to be used in this example are shown below.

Compound 4

Compound 5

Compound 6

(1) Substrate

First, a TFT driver circuit (not shown) formed of low-temperature polysilicon was formed on a glass base material. Next, an acrylic resin was formed into a film on the TFT driver circuit to form a planarizing film (not shown). A substrate (the substrate 10) in which the TFT driver circuit and the planarizing film had been sequentially formed on the glass base material as described above was used in the next step.

(2) Step of Forming Lower Electrode (Light Reflective Electrode, Anode)

Next, an Ag alloy was formed into a film on the substrate 10 by a sputtering method to form an Ag alloy film. At this time, the thickness of the Ag alloy film was set to 150 nm. Next, the Ag alloy film was subjected to patterning according to an emission region to form the lower electrode 21. It is to be noted that the lower electrode 21 in this example functions as a light reflective electrode and an anode.

Next, a polyimide-based resin was formed into a film on the substrate 10 and the lower electrode 21 by a spin coating method to form a polyimide film. Next, the polyimide film was subjected to patterning by employing a photolithography method so that the emission region became an opening portion.

(3) Step of Forming Hole Injection/Transport Layer

Next, Compound 2 (hole transport material having a refractive index at λ=460 nm of 1.65) was formed into a film on the lower electrode 21 by a vacuum deposition method to form a hole injection/transport layer (the first charge injection/transport layer 22). At this time, the thickness of the hole injection/transport layer was set to 37 nm.

(4) Step of Forming Emission Layer

Next, Compound 4 (host) and Compound 5 (dopant) were codeposited from the vapor onto the hole injection/transport layer to form the emission layer 23. At this time, the thickness of the emission layer 23 was set to 15 nm, and the film formation rates of the host and the dopant were set to 0.98 Å/s (host) and 0.02 Å/s (dopant), respectively. It is to be noted that the refractive index (n) of the emission layer 23 at a wavelength of 460 nm is 1.85.

(5) Step of Forming Electron Injection/Transport Layer

Next, Compound 6 was formed into a film having a thickness of 10 nm on the emission layer 23 by a vacuum deposition method. Next, a codeposited film of Compound 6 and Cs having a thickness of 20 nm was formed. It is to be noted that a laminate formed of the layer formed only of Compound 6, and the layer containing Compound 6 and Cs functions as an electron injection/transport layer (the second charge injection/transport layer 24). In addition, it is because electron injection property should be secured that the layer containing Compound 6 and Cs is incorporated into the electron injection/transport layer.

(6) Step of Forming Upper Electrode (Light Transmissive Electrode, Cathode)

Next, Ag was formed into a film on the electron injection/transport layer by a sputtering method to form the upper electrode 25. At this time, the thickness of the upper electrode 25 was set to 12 nm. It is to be noted that the upper electrode 25 in this example functions as a light transmissive electrode and a cathode.

(7) Step of Forming Protective Layer

Next, SiN was formed into a film on the upper electrode 25 by a CVD method to form the protective layer 30. At this time, the thickness of the protective layer 30 was set to 2 μm.

(8) Step of Forming Light Extraction Member

Finally, a lens array sheet was attached onto the protective layer 30. It is to be noted that the lens array sheet functions as the condensing unit 40. The organic EL element was produced as described above.

(9) Evaluation of Element

The resultant element was evaluated for its external quantum efficiency. Table 6 shows the results.

Comparative Example 1

An organic EL element was produced by the same method as that of Example 1 with the exception that a hole injection/transport layer was formed by the following step in the section (3) of Example 1.

(Step of Forming Hole Injection/Transport Layer)

Compound 1 shown below (having a refractive index at λ=460 nm of about 1.85) was formed into a film on the lower electrode 21 to form a hole injection/transport layer. At this time, the thickness of the hole injection/transport layer was set to 32 nm.

The resultant element was evaluated for its external quantum efficiency by the same method as that of Example 1. Table 6 shows the results.

TABLE 6

|  | Example 1 | Comparative Example 1 |
| --- | --- | --- |
| Without light extraction member | 3.9% | 2.8% |
| With light extraction member | 7.5% | 5.8% |

<Evaluation of Element>

As can be seen from Table 6, the organic EL element of Example was superior to the organic EL element of Comparative Example from the viewpoint of the external quantum efficiency. In addition, as shown in Table 6, when the low-refractive index layer was introduced as a hole injection/transport layer, the external quantum efficiency increased by 1.1% (3.9%−2.8%=1.1%). Meanwhile, when the lens array as a light extraction member was introduced, the external quantum efficiency increased by 3% (5.8%−2.8%=3%). In addition, when the low-refractive index layer was introduced as a hole injection/transport layer and the lens array was introduced, the external quantum efficiency increased by 4.7% (7.5%−2.8%=4.7%). In other words, it was found that the value by which the external quantum efficiency increased when the low-refractive index layer and the lens array were introduced was higher than a mere sum (4.1%) of the value by which the external quantum efficiency increased through the introduction of the low-refractive index layer and the value by which the external quantum efficiency increased through the introduction of the lens array.

This is probably because a plasmon-suppressing effect by the low-refractive index layer and an effect in which guided light is efficiently extracted by the light extraction member show a synergistic effect.

EXAMPLE 2

An organic EL element illustrated in FIG. 1B was produced by the following method. It is to be noted that the organic EL element to be produced in this example is a blue organic EL element.

(1) Substrate

First, the substrate 10 was produced by the same method as the section (1) of Example 1.

(2) Step of Forming Lower Electrode (Light Reflective Electrode, Anode)

Next, an Al alloy was formed into a film on the substrate 10 by a sputtering method to form an Al alloy film. At this time, the thickness of the Al alloy film was set to 150 nm. Next, Mo was formed into a film on the Al alloy film to form an Mo film. At this time, the thickness of the Mo film was set to 5 nm. Next, a laminated electrode film obtained by laminating the Al alloy film and the Mo film in the stated order was subjected to patterning according to an emission region to form the lower electrode 21. It is to be noted that the lower electrode 21 in this example functions as a light reflective electrode and an anode.

Next, a polyimide-based resin was formed into a film on the substrate 10 and the lower electrode 21 by a spin coating method to form a polyimide film. Next, the polyimide film was subjected to patterning by employing a photolithography method so that the emission region became an opening portion.

(3) Step of Forming Hole Injection/Transport Layer and the Like

Next, Compound 1 and LiF were codeposited from the vapor onto the lower electrode 21 at a mass mixing ratio of 60:40 to form a hole injection/transport layer (the first charge injection/transport layer 22). At this time, the thickness of the hole injection/transport layer was set to 55 nm. It is to be noted that in this example, the refractive index of the hole injection/transport layer at a wavelength of 540 nm is 1.68.

Next, TCTA shown below (having a refractive index at a wavelength of 540 nm of 1.8) was formed into a film to form an electron-blocking layer (the third charge injection/transport layer 26). At this time, the thickness of the electron-blocking layer was set to 10 nm.

TCTA (4) Step of Forming Emission Layer

Next, UGH2 (host), PQIr (phosphorescent dopant), Ir(ppy)₃ (phosphorescent dopant), and FIr6 (phosphorescent dopant) shown below were codeposited from the vapor onto the electron-blocking layer to form the emission layer 23. At this time, the thickness of the emission layer 23 was set to 10 nm, and the concentrations of the host and the dopants were set to 77.5 wt % (UGH2), 2 wt % (PQIr), 0.5 wt % (Ir(ppy)₃), and 20 wt % (FIr6), respectively. It is to be noted that the term "concentration" as used herein refers to a concentration in a wt % unit with reference to the entirety of the emission layer. In addition, in this example, white light is output from the emission layer 23.

UGH2

PQIr

Ir(ppy)₃

FIr6

(5) Step of Forming Electron Injection/Transport Layer

An electron injection/transport layer (the second charge injection/transport layer 24) was formed on the emission layer 23 by the same method as the section (5) of Example 1.

(6) Step of Forming Upper Electrode (Light Transmissive Electrode, Cathode)

Next, an indium zinc oxide was formed into a film on the electron injection/transport layer by a sputtering method to form the upper electrode 25. At this time, the thickness of the upper electrode 25 was set to 100 nm. It is to be noted that the upper electrode 25 in this example functions as a light transmissive electrode and a cathode.

(7) Step of Forming Protective Layer

The protective layer 30 was formed on the upper electrode 25 by the same method as that of the section (7) of Example 1.

(8) Step of Forming Light Extraction Member

A lens serving as the light extraction member 40 was formed on the protective layer 30 by the same method as that of the section (8) of Example 1. Thus, the organic EL element was obtained.

(9) Evaluation of Element

The resultant element was evaluated for its external quantum efficiency by the same method as that of Example 1. Table 7 shows the results.

Comparative Example 2

An organic EL element was produced by the same method as that of Example 2 with the exception that a hole injection/transport layer was formed by the following step in the section (3) of Example 2.

(Step of Forming Hole Injection/Transport Layer)

Compound 1 shown below (having a refractive index at λ=540 nm of about 1.80) was formed into a film on the lower electrode 21 to form a hole injection/transport layer. At this time, the thickness of the hole injection/transport layer was set to 51 nm.

The resultant element was evaluated for its external quantum efficiency by the same method as that of Example 1. Table 7 shows the results.

TABLE 7

|  | Example 2 | Comparative Example 2 |
|---|---|---|
| Without light extraction member | 16.2% | 15.1% |
| With light extraction member | 57.3% | 51.7% |

<Evaluation of Element>

As can be seen from Table 7, the organic EL element of Example was superior to the organic EL element of Comparative Example from the viewpoint of the external quantum efficiency. In addition, as shown in Table 7, when the low-refractive index layer was introduced as a hole injection/transport layer, the external quantum efficiency increased by 1.1% (16.2%−15.1%=1.1%). Meanwhile, when the lens array as a light extraction member was introduced, the external quantum efficiency increased by 36.6% (51.7%−15.1%=36.6%). In addition, when the low-refractive index layer was introduced as a hole injection/transport layer and the lens array was introduced, the external quantum efficiency increased by 42.2% (57.3%−15.1%=42.2%). In other words, it was found that the value by which the external quantum efficiency increased when the low-refractive index layer and the lens array were introduced was higher than a mere sum (37.7%) of the value by which the external quantum efficiency increased through the introduction of the low-refractive index layer and the value by which the external quantum efficiency increased through the introduction of the lens array.

This is probably because a plasmon-suppressing effect by the low-refractive index layer and an effect in which guided light is efficiently extracted by the light extraction member show a synergistic effect.

According to one embodiment of the present invention, the high-efficiency organic EL element can be provided. That is, the organic EL element of the present invention becomes an organic EL element having efficiency higher than the conventional one by virtue of a synergistic effect with a light extraction member while suppressing energy loss to a plasmon on the surface of a light reflective electrode.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-079339, filed Apr. 5, 2013, which is hereby incorporated by reference herein in its entirety.

What is claimed is:

1. An organic electroluminescence element, comprising:
a light reflective electrode;
a light transmissive electrode;
an emission layer formed between the light reflective electrode and the light transmissive electrode;
a low-refractive index layer having a refractive index at a maximum peak wavelength of an emission spectrum of light emitted from the emission layer lower than that of the emission layer, the low-refractive index layer being formed between the light reflective electrode and the emission layer; and
a light extraction member for changing an exiting direction of the light emitted from the emission layer, the light extraction member being formed on the light transmissive electrode,
wherein an optical path L between a maximum emission surface of the emission layer and a reflection surface of the light reflective electrode satisfies the following expression (1):

$$\left(-1-\frac{\phi}{90}\right)\times\left(\frac{\lambda}{8}\right)<L<\left(1-\frac{\phi}{90}\right)\times\left(\frac{\lambda}{8}\right) \quad (1)$$

in the expression (1), $\lambda$ represents the maximum peak wavelength of the emission spectrum and $\phi$ represents a phase shift [deg] in the light reflective electrode.

2. The organic electroluminescence element according to claim 1, wherein a thickness of the low-refractive index layer is one half or more of a distance between the emission layer and the light reflective electrode.

3. The organic electroluminescence element according to claim 1, wherein a light transmittance in the light transmissive electrode is 60% or more.

4. The organic electroluminescence element according to claim 1, further comprising a nonmetal member formed between the emission layer and the light extraction member, wherein a refractive index of the nonmetal member is higher than that of the emission layer.

5. The organic electroluminescence element according to claim 1, wherein a luminescent color of the organic electroluminescence element comprises a white color.

6. A display apparatus, comprising multiple pixels, wherein at least one of the multiple pixels includes the organic electroluminescence element according to claim 1 and an active element connected to the organic electroluminescence element.

7. An image information processing apparatus, comprising:
an input portion for inputting image information; and
a display portion for displaying an image,
wherein the display portion comprises the display apparatus according to claim 6.

8. An imaging apparatus, comprising:
the display apparatus according to claim 6; and
an imaging element,
wherein the display apparatus is included in a display portion for displaying information concerning an image photographed with the imaging element.

9. A lighting apparatus, comprising:
the organic electroluminescence element according to claim 1; and
an AC/DC converter circuit for supplying a driving voltage to the organic electroluminescence element.

10. An image forming apparatus, comprising:
a photosensitive member;
a charging portion for charging a surface of the photosensitive member;
an exposure portion for exposing the photosensitive member; and
a developing unit for developing an electrostatic latent image formed on the surface of the photosensitive member,
wherein the exposure portion includes the organic electroluminescence element according to claim 1.

* * * * *